United States Patent
Lee et al.

[11] Patent Number: 6,159,850
[45] Date of Patent: Dec. 12, 2000

[54] METHOD FOR REDUCING RESISTANCE OF CONTACT WINDOW

[75] Inventors: Tzung-Han Lee, Taipei; Chien-Li Kuo, Hsinchu Hsien, both of Taiwan

[73] Assignee: United Microelectronics Corp., Hsinchu, Taiwan

[21] Appl. No.: 09/130,944

[22] Filed: Aug. 7, 1998

[30] Foreign Application Priority Data

Jun. 16, 1998 [TW] Taiwan ................ 87109585

[51] Int. Cl.$^7$ ................ H01L 21/44
[52] U.S. Cl. ................ 438/665
[58] Field of Search ................ 438/665, 637

[56] References Cited

U.S. PATENT DOCUMENTS

| | | | |
|---|---|---|---|
| 4,686,000 | 8/1987 | Heath | 438/702 |
| 4,961,165 | 10/1990 | Ema | 365/182 |
| 5,203,957 | 4/1993 | Yoo et al. | 438/640 |
| 5,605,637 | 2/1997 | Shan et al. | 216/71 |
| 5,670,426 | 9/1997 | Kuo et al. | 438/637 |

OTHER PUBLICATIONS

S. A. Campbell, The Science and Engineering of Microelectronic Fabrication, Oxford University Press, New York, 1996.

*Primary Examiner*—Richard Elms
*Assistant Examiner*—Christian D. Wilson
*Attorney, Agent, or Firm*—J. C. Patents; Jiawei Huang

[57] ABSTRACT

A method of reducing resistance of a contact. A semiconductor substrate having at least a conductive lines formed thereon is provided. A self-aligned contact window is formed to expose a part of the substrate. A recess with a ragged surface is formed on the exposed part of substrate within the contact window.

20 Claims, 3 Drawing Sheets

METHOD FOR REDUCING RESISTANCE OF CONTACT WINDOW

CROSS-REFERENCE TO RELATED APPLICATION

This application claims the priority benefit of Taiwan application serial no. 87109585, filed Jun. 16, 1998, the fall disclosure of which is incorporated herein by reference.

BACKGROUND OF THE INVENTION

1. Field of the Invention

The invention relates in general to a method of reducing the resistance of a contact ($R_c$), and more particularly, to a method of reducing the resistance of a self-aligned contact (SAC).

2. Description of the Related Art

Due to the higher and higher integration of integrated circuits, the dimensions of semiconductor devices in the integrated circuits become smaller and smaller. The devices cannot provide a sufficiently large surface area to fabricating various interconnects for electrical connection between different electrodes in the devices, so cannot the integrated circuits provide a sufficient large surface area to fabricate various interconnects to electrically connect different electrodes or devices. As a consequence, two or more metal layers are required to achieve the interconnection between different electrodes or devices. Conventionally, these metal layers are insulated by various isolation structures or dielectric layers and coupled with each other by a contact via/plug penetrating through the dielectric layers.

Another consequence of high integration is that the line width of devices becomes shorter and shorter. While transferring a pattern of a contact window from a photo-mask, extremely high resolution and very little misalignment are required. Poor resolution can form a void within the contact window or form a short circuit or current leakage between devices due to a very large aspect ratio of the contact window. Any misalignment can cause a short circuit or a leakage current of devices after subsequent etching process. A self-aligned contact window is commonly used to help resolve these problems.

FIG. 1A to FIG. 1C show a conventional method of forming a self-aligned contact window. In FIG. 1A, gates 102 and spacers 104 around the gates 102 are formed on a substrate 100. A cap layer 106 is formed to cover the gates 102 between the spacers 104. The material of the spacers 104 and the cap layer 106 comprises silicon nitride formed by plasma chemical vapour deposition. The formation of the spacers 104 and the cap layer 106 prevents the gates 102 from being etched in the subsequent etching process. An oxide layer 108 is formed by conventional chemical vapour deposition.

In FIG. 1B, a photo-resist layer 110 with an opening 112 is formed on the oxide layer 108. The opening 112 is aligned over a predetermined source/drain region between the gates 102. Therefore, the oxide layer 108 on top of the predetermined source/drain region between the gates 102 is exposed within the opening 112. However, in case of a misalignment, the opening 112 exposes a part of the oxide layer 108 on top of the gates 102. An anisotropic dry etching is performed to etch the oxide layer 108 exposed by the opening 112, so that a contact window 116 is formed to expose the substrate 100 below the opening 112. Because of the high etching selectivity of oxide compared to the material of the spacers 104 and the cap layers 106, the exposed oxide layer 108 is removed without etching the spacers 104 and the cap layers 106. Even when the opening 112 is mis-aligned and the oxide layer 108 on the gates 102 are exposed, being protected by the spacers 104 and the cap layers 106, the gate 102 is also not etched or even damaged during the etching process that forms the contact 116 window.

The above process is called as a "self-aligned" method of fabricating a contact window. With the formation of spacers 104 around the gates 102 and the cap layers 106 on the gates 104, the gates 102 are protected from being etched or damaged. A contact window 116 is formed without causing leakage current or open circuit. However, as the line width of devices becomes narrower and narrower, the gates 102 become closer together and the contact surface of the contact windows 116 shrinks. The resistance of a conductive material, for example, tungsten, formed within the contact window in the subsequent process increases. One experiment shows that the resistance between the self-aligned contact and the substrate is as high as 111 to 113 $\mu\Omega$cm. With such a high resistance, the contact cannot form a good electrical connection between different metal layers or electrodes. An open circuit thus occurs. There is thus a need for a way to improve the conductance of the contact window 116 as the line width becomes increasingly narrow.

SUMMARY OF THE INVENTION

It is therefore an object of the invention to provide a method of fabricating a contact window with a reduced contact resistance by using soft etching. As the contact resistance of the contact window is reduced, the conductance of the contact window is increased. An ion implantation is further performed on the contact window, so that a leakage current is prevented. By applying the self-aligned technique, a self-aligned contact window is formed without unwanted interconnection between electrodes and other conductive layers. When the self-aligned contact window is formed, a soft etch forms a recess with a ragged or roughened surface on the substrate exposed within the contact window. The contact surface between the electrode of the substrate and the contact subsequently formed within the contact window is enlarged because the ragged or roughened surface increases the surface area. As a consequence, the resistance between the electrode and the substrate is reduced. In contrast, the conductivity between the electrode and the substrate is increased. Furthermore, with the formation of a charge barrier, a leakage current is suppressed.

DETAILED DESCRIPTION

Figure 1A:
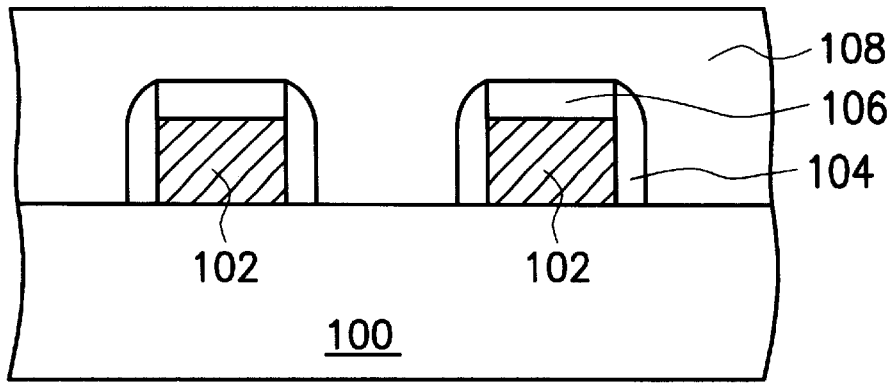
FIGS. 1A to 1C are cross-sectional views of a conventional method for forming a self-aligned contact window.
Figure 1B:
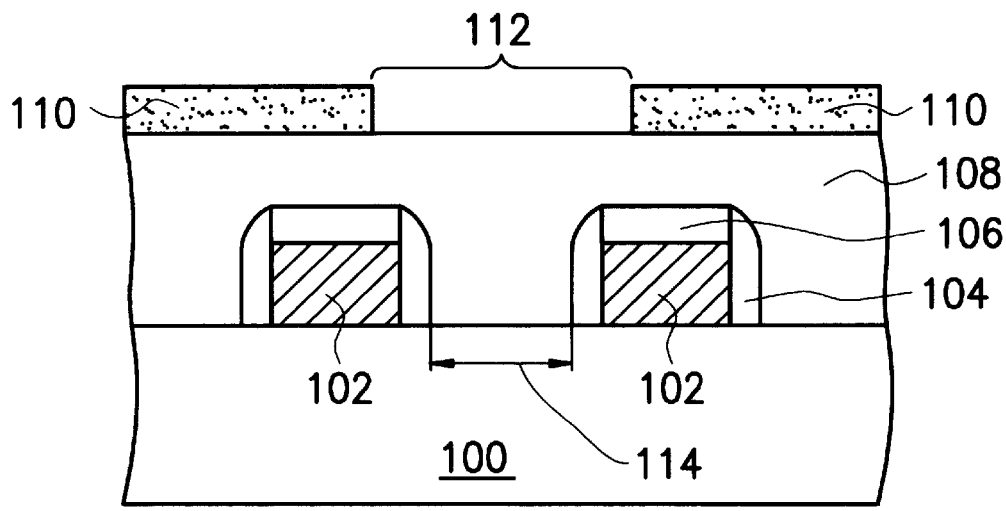
Figure 1C:
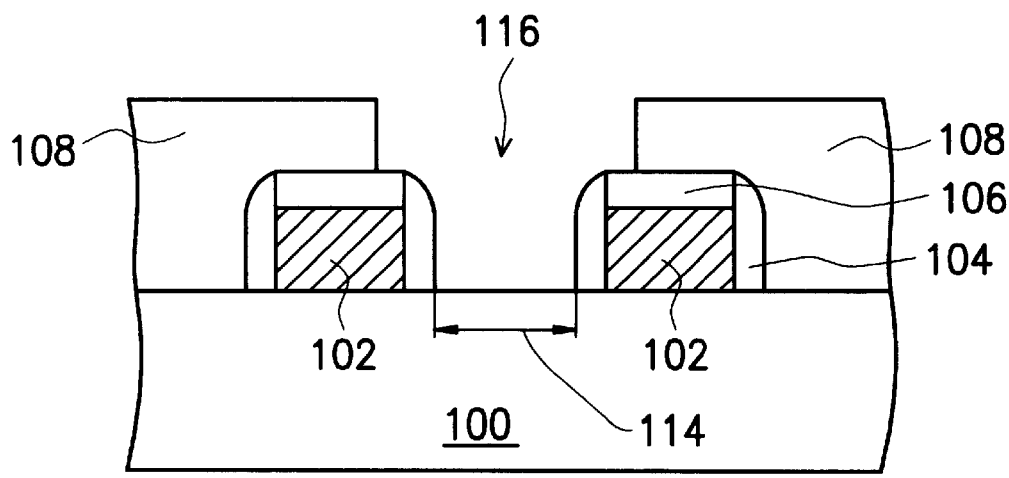
Figure 2A:
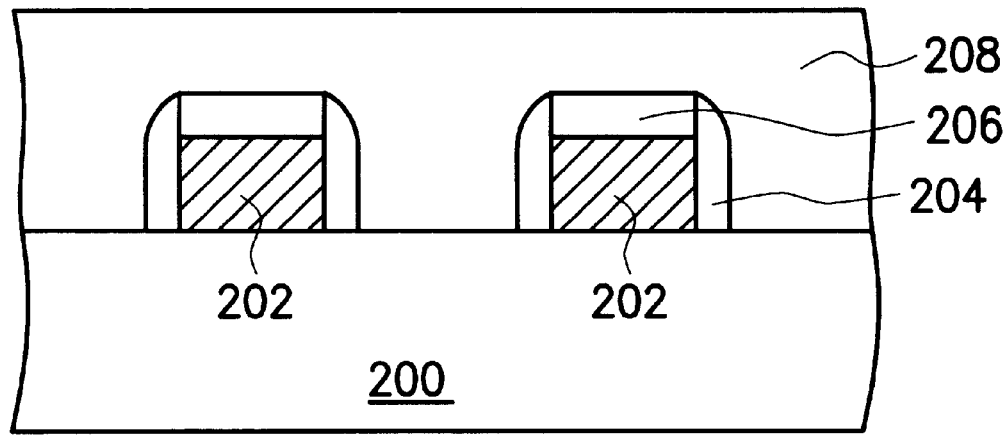
FIGS. 2A to 2D are cross sectional views of an improved method of fabricating a self-aligned contact window.

In FIG. 2A, conductive lines, for example, gates 202 in this embodiment, are formed on a semiconductor substrate 200. On each side wall of the gates 202, a spacer 204 is formed. Furthermore, on the gates 202 and between the spacers 204, a cap layer 206 is formed. The materials of the spacers 204 and the cap layers 206 are selected to protect the gates 202 during the later process steps. For example, silicon nitride formed by plasma chemical vapor deposition (PCVD) or low pressure chemical vapor deposition (LPCVD) can advantageously to protect the gates 202 from being removed in the subsequent etching process. Therefore, when a conductive layer is formed between the gates 202 subsequently, an unwanted electrical connection between the gates 202 and other conductive parts via the conductive layer is avoided. Next, an oxide layer 208 is formed, for example, by chemical vapor deposition, over the substrate 200, the gates 202, the spacers 204, and the cap layers 206.

Figure 2B:
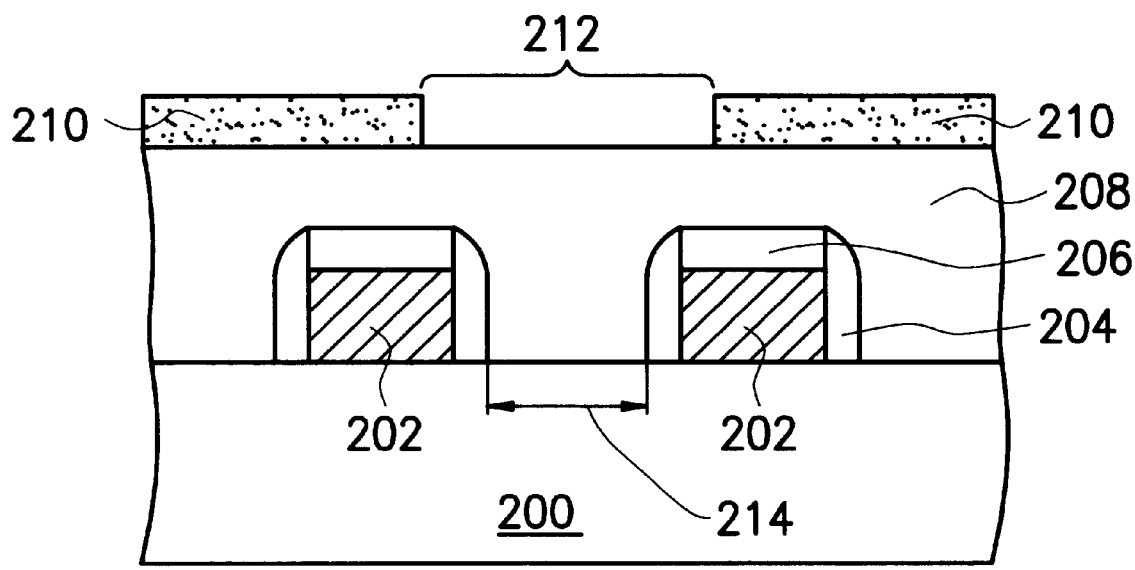
Figure 2C:
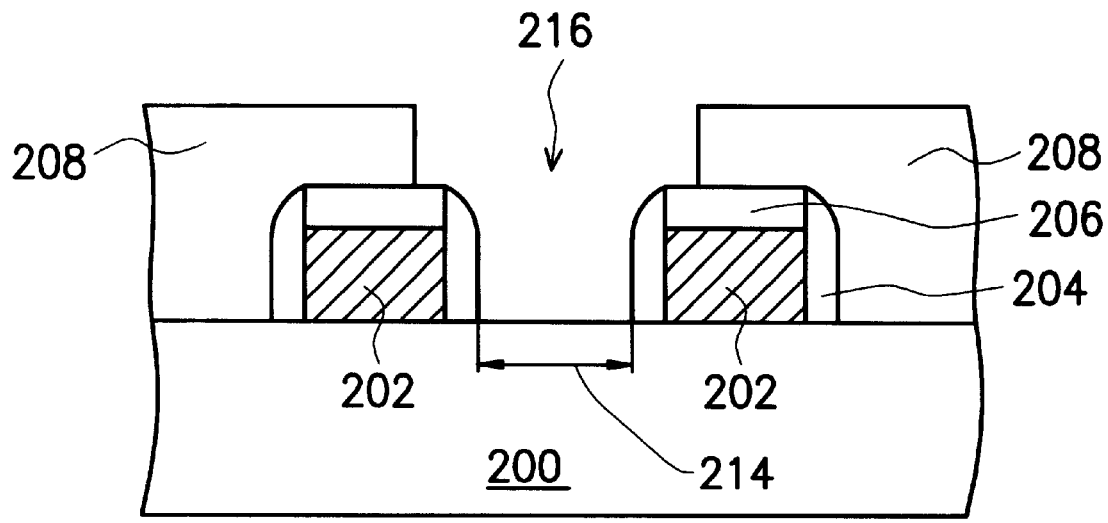

In FIG. 2B, using photolithography and etching, a photo-resist layer 210 with an opening 212 is formed on the oxide layer 208. The opening 212 is positioned to expose the oxide layer 208 between the gates 202, in this example, the region of the substrate 200 between gates 202 is a conductive region, such as a source/drain region 214 in the example. Advantageously, a dry etching step is then performed. Using an etching gas with a high etching selectivity to oxide compared to material of the spacers 204 and the cap layers 206, an anisotropic dry etching is performed to remove the exposed oxide layer 208. The substrate 200 between the gates 202 is thus exposed. The photo-resist layer 210 is then removed, and a contact window 216 is formed as shown in FIG. 2C. As mentioned above, the etching gas used for the dry etching process has a high selectivity of oxide layer compared to the material of the spacers 204 and the cap layers 206. Thus, while etching the exposed oxide layer 208, advantageously only a very small portion of the spacers 204 and the cap layers 206 is removed. Therefore, the gates 202 covered by the spacers 204 and the cap layers 206 are protected from being etched.

Figure 2D:
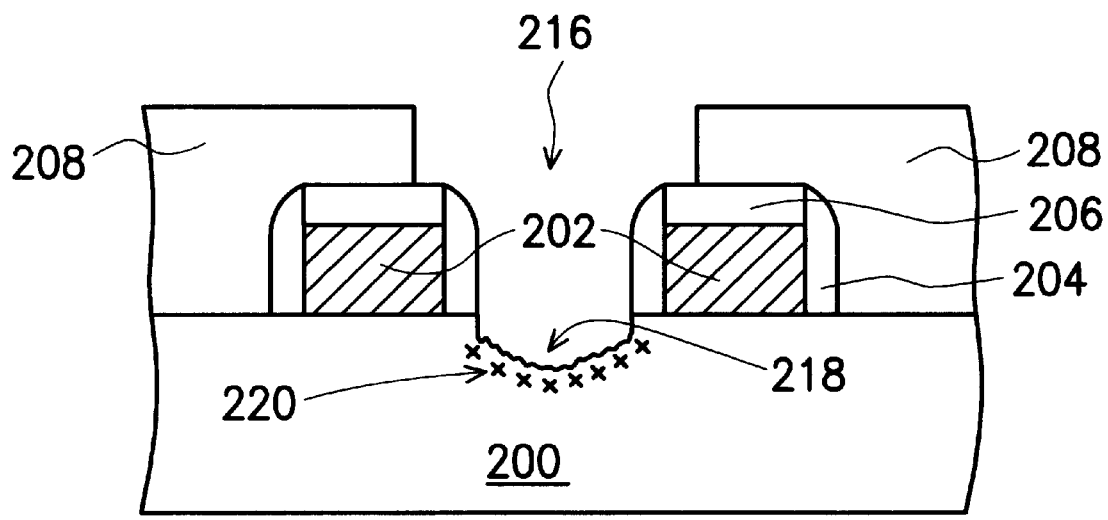

In FIG. 2D, a soft etch is performed. During the above-mentioned dry etching process, a bias is applied to discharge the etching gas or to accelerate ions of the etching gas in certain direction. In the step of soft etch, the bias is turned lower to a predetermined level as required, or preferably, even switched off. A recess 218 is formed by removing a part of the exposed substrate 200 within the contact window 216. The contact window 216 is thus deepened with the recess 218. A depth d of the recess 218 is believed suitable of up to 300Å, and is preferably about 100Å to 300Å deep. Depending on the application, the depth may be greater. Since the recess 218 is formed by soft etch while applying a reduced bias, ions of etching gas have a non-uniform direction during etching, and the etching speed is slow. As a result, a ragged or roughened surface and an uneven profile are formed on the exposed substrate 200, that is, on a surface of the recess 218. The contact surface of the contact window 216 is thus increased. It is known that the resistance is inversely proportional to the contact area between, therefore, the resistance between the source/drain region 214 and a contact plug formed subsequently in the contact window 216 is reduced with this enlarged contact surface. Alternatively phrased, the increased surface area of the recess 218 causes a decrease in contact resistance. Advantageously, the bias is at least a factor of 10 lower then the bias during the prior dry etching step, and preferably a zero bias is used.

Unfortunately, charges in the substrate are easier to leak from the ragged surface or uneven profile than from a uniform surface. Therefore, the contact window with a recess, though has a larger contact surface area, causes a higher leakage of charges. The soft etch step and the roughened surface might thus appear undesired. To avoid the charge leakage, ions such as N-type ions or P-type ions are implanted to form a charge barrier 220 under the contact surface of the profile of the recess 218.

The above embodiment is an example of the invention. This technique of reducing the resistance of a contact window can also be advantageously applied for electrically connecting a conductive region adjacent to a conductive line to another conductive layer, a conductive region between two conductive lines and another conductive lines, or to couple a conductive layer such as a gate, a poly-silicon line, a conductive wiring, or a metal line in or on a substrate with another conductive layer.

According to the invention, a contact window with an enlarged contact surface is formed by using the self-alignment technique and soft etching. By the self-aligned technique, even when misalignment occurs, unwanted connections between different electrodes or layers are avoided. By adding a soft etch process, the contact surface area of the contact window is enlarged. It is known that the resistance is inversely proportional to the contact area. Therefore, the resistance between the substrate and a contact plug subsequently formed in the contact window is reduced efficiently. Furthermore, with the formation of a charge barrier, the charge leakage is avoided.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method of forming an electrically enhanced contact surface in a self-aligned contact window comprising the steps of:

providing a substrate having a plurality of gates, wherein each gate has a spacer on each side wall of the gate and a cap layer on the gate;

forming an oxide layer over the gates and the substrate;

forming a photo-resist layer with an opening on the oxide layer, wherein the opening exposes a part of the oxide layer aligned with a predetermined source/drain region of the substrate between the gates;

etching the oxide layer using the photo-resist layer, the spacer and the cap layer as a mask to form the contact window to expose the predetermined source/drain region;

etching the predetermined source/drain region by a soft-etching process and forming a recess with a rough surface within the contact window; and performing an ion implantation to form a charge barrier underlying a top surface of the predetermined source/drain region to prevent charge leakage due to the rough surface of the recess.

2. The method according to claim 1, wherein the recess is formed with a depth between 100 Å to 300 Å.

3. The method according to claim 1, wherein the ions used in the ion implantation for forming the charge barrier are P-type ions.

4. The method according to claim 1, wherein the ions used in the ion implantation for forming the charge barrier are N-type ions.

5. The method according to claim 1, wherein the spacer is formed by silicon nitride.

6. The method according to claim 1, wherein the cap layer is formed by silicon nitride.

7. The method according to claim 1, wherein the etching of the oxide layer is a high selective anisotropic etching.

8. A method of forming an electrically enhanced contact surface in a self-aligned contact window comprising the steps of:

providing a substrate on which at least a pair of gates is formed with a spacer on each side wall of the gate, a cap layer on the gate and an oxide layer over the gate and the substrate;

patterning the oxide layer to form a contact window to expose the substrate between the gates;

etching the substrate by a soft-etching process and forming a recess with a rough surface within the contact window; and performing an ion implantation to form a charge barrier underlying the rough surface of the recess to prevent charge leakage due to the rough surface.

9. The method according to claim 8, wherein the exposed substrate within the contact window comprises a predetermined source/drain region.

10. The method according to claim 8, wherein the etching of the oxide layer is a high selective anisotropic etching.

11. The method according to claim 8, wherein the soft-etching process is an isotropic etching with a reduced bias.

12. The method according to claim 8, wherein the soft-etching process is an isotropic etching with a zero bias.

13. The method according to claim 8, wherein the recess is formed with a depth between 100 Å to 300 Å.

14. The method according to claim 8, wherein the ions used in the ion implantation for forming the charge barrier are P-type ions.

15. The method according to claim 8, wherein the ions used in the ion implantation for forming the charge barrier are N-type ions.

16. The method according to claim 8, wherein the spacer is formed by silicon nitride.

17. The method according to claim 8, wherein the cap layer is formed by silicon nitride.

18. The method according to claim 1, wherein the charge barrier is substantially not formed under the gates.

19. The method according to claim 8, wherein the charge barrier is substantially not formed under the gates.

20. The method according to claim 1, wherein the soft-etching process is an isotropic etching with a zero bias.

* * * * *